United States Patent [19]
Noda

[11] Patent Number: 5,825,702
[45] Date of Patent: Oct. 20, 1998

[54] SYNCHRONOUS STORAGE DEVICE AND METHOD OF READING OUT DATA FROM THE SAME

[75] Inventor: Kazuyuki Noda, Tokyo, Japan

[73] Assignees: Mitsubishi Electric Engineering Company Limited; Mitsubishi Denki Kabushiki Kaisha, both of Tokyo, Japan

[21] Appl. No.: 12,408

[22] Filed: Jan. 23, 1998

[30] Foreign Application Priority Data

Sep. 11, 1997 [JP] Japan ..................................... 9-247241

[51] Int. Cl.$^6$ .................................................. G11C 13/00
[52] U.S. Cl. ...................................... 365/203; 365/189.01
[58] Field of Search ............................. 365/203, 189.01, 365/230.01, 154

[56] References Cited

U.S. PATENT DOCUMENTS 4,272,834  6/1981  Noguchi et al. .
5,455,803  10/1995  Kodama ................................. 365/233

*Primary Examiner*—Terrell W. Fears
*Attorney, Agent, or Firm*—Burns, Doane, Swecker & Mathis, LLP

[57] ABSTRACT

A potential of a reference-voltage line is compared with those of bit lines which were precharged to a zero in advance and, when the latter becomes equal to the former, a clock signal supplied to a precharge circuit is forcibly changed from "H" level to "L" level.

5 Claims, 9 Drawing Sheets

REFERENCE-VOLTAGE LINE

COMPARATOR

SYNCHRONOUS STORAGE DEVICE AND METHOD OF READING OUT DATA FROM THE SAME

This application claims priority under 35 U.S.C. §§ 119 and/or 365 to Application No. 247241/97 filed in Japan on Sep. 11, 1997; the entire content of which is hereby incorporated by reference.

BACKGROUND OF THE INVENTION

The present invention relates to a synchronous storage device operating synchronously with a clock signal and a method of reading out data from the same. More specifically, the present invention relates to a synchronous storage device with a shortened cycle time to read out data from the synchronous storage device and a method of reading out data from the synchronous storage device

DESCRIPTION OF THE PRIOR ART

FIG. 10 is a diagram showing a configuration of main components composing the conventional synchronous RAM. In the drawing, reference numerals 1 and 2 denote a memory cell for storing data and a memory plane respectively; the memory plane 2 is an area in which the memory cells 1 are laid out to form a matrix comprising rows and columns. Reference numerals $3_0$ to $3_m$ are each a word line connected to pass transistors of the memory cells 1 on a row; the pass transistors are used for selecting the respective memory cell 1. Reference numerals 4 and 5 each denote a bit line connected to the memory cells 1 on a column; the bit lines 4 and 5 are used for transferring data. Reference numeral 6 is an address decoder for decoding an address signal A; a result of the address decoding carried out by the address decoder 6 selects one of the word lines $3_0$ to $3_m$. Reference numeral 7 is a precharge circuit for electrically precharging the bit lines 4 and 5. Reference numeral 8 denotes a column selector for selecting a column of memory cells 1 laid out on the memory plane 2 as a column on which a read or write operation is to be carried out.

Reference numeral 9 is a sense amplifier for reading out data from one of the memory cells 1 selected by the address decoder 6 and the column selector 8. On the other hand, reference numeral 10 denotes a write driver for writing data into one of the memory cells 1 selected by the address decoder 6 and the column selector 8. Reference numeral 11 is an address bus for propagating the address signal A to the address decoder 6. Reference numeral 12 denotes a clock signal T supplied by an external source. Reference numeral 13 is a data bus for outputting data DO generated by the sense amplifier 9. Reference numeral 14 denotes a signal line for propagating a write enable signal WEC and reference numeral 15 is a data bus for propagating data DI to be written into one of the memory cells 1 by the write driver 10.

The operation of the synchronous RAM shown in FIG. 10 is explained as follows.

FIG. 11 shows timing charts of an operation to read out data from the conventional RAM. In the drawing, (a) shows a timing chart of a clock signal T12; (b) shows a timing chart of the address signal A; (c) shows a timing chart of the data DO read out from a memory cell 1. During "1" period of the clock signal T12, the precharge circuit 7 electrically charges up the bit lines 4 and 5 to "H"(high) level, raising signals BIT and BITC appearing on the bit lines 4 and 5 respectively to "1". As the clock signal T12 falls to "0", the address decoder 6 is enabled, decoding the address signal A to select either of the word lines $3_0$ to $3_m$. The address signal A becomes active, preceding the fall of the clock signal T12 by a set-up time denoted by arrows 20 in FIG. 11.

One of the word lines $3_0$ to $3_m$ selected by the address decoder 6 is raised to "H" level, causing data of the memory cells 1 connected to the selected word line $3_n$, where n is a number in the range 0 to m, to be output to the bit lines 4 and 5. The data of one of the memory cells 1 connected to the selected word line $3_n$ (where n is a number in the range 0 to m) which is selected by the column selector 8 is then read out as the data DO. A period denoted by arrows 21 in the drawing between the falling edge of the clock signal T12 and a point of time the data DO becomes available is known as an access time of the RAM device. The access time includes the time it takes the address decoder 6 to activate one of the word lines $3_0$ to $3_m$, a delay time of the memory cell 1, the time it takes the column selector 8 to select a pair of bit lines 4 and 5, and the operation time of the sense amplifier 9.

SUMMARY OF THE INVENTION

Since the conventional synchronous storage device and a method of reading out data from the synchronous storage device have configurations described above, there is raised a problem that the width of the precharge period cannot be adjusted properly and it is thus difficult to produce a short read cycle time that satisfies the precharge period and the access time of the data.

The present invention has been implemented to solve the problem described above, and it is thus an object of the present invention to provide a synchronous storage device and a method of reading out data from the synchronous storage device that allow the read-cycle time to be shortened by automatically setting the width of the precharge time at a proper value.

According to a first aspect of the present invention, there is provided a synchronous storage device wherein a precharge-time-width reducing means compares the potential of a reference-voltage line to which a potential for activating one of pairs of bit lines is applied with those of bit lines which were precharged to zero in advance and, when the latter becomes equal to the former, a clock signal supplied to a precharge circuit is forcibly changed from "H" level to "L"(low) level. As a result, there is exhibited an effect that the length of a precharge period can be reduced to a required minimum, allowing a read cycle time to be shortened as well.

According to a second aspect of the present invention, in the precharge-time-width reducing means employed in the synchronous storage device, a dummy precharge circuit is used for holding the potential of the reference-voltage line at "H" level;

a plurality of dummy memory cells compose a particular one of the columns wherein, when one of the word lines is activated, a particular one of bit lines of one of the pairs of bit lines associated with the particular column is reset to "L" level while the other bit line of the pair is set to "H" level to make electric charges of inactivated ones of the word lines equal;

a dummy column selector is used for adding electric charges of amounts equal to each other to the bit lines associated with the particular column, for adding an electric charge of an amount equal to that of the ordinary memory cell to the particular bit line on an output side of the dummy column selector and for adding an electric charge of the same amount to a signal appearing on the reference-voltage line; and a comparator is used for comparing a potential of a signal appearing on the pair of bit lines associated with the particular column with a potential of the signal appearing on the reference-voltage line which both have the electric charge added by the dummy column selector and for outputting a match signal when both the potentials become equal to each other; and an AND circuit is used for generating an internal clock signal representing a computed logical product of the inverted signal of the match signal output by the comparator and the clock signal supplied by the external source and for outputting the internal clock signal to the precharge circuit.

As a result, there is exhibited an effect that the length of a precharge period can be reduced to a required minimum, allowing a read cycle time to be shortened as well.

According a third aspect of the present invention, the comparator employed in the synchronous storage device comprises a current-mirror-type amplifier, a cross-couple-type amplifier and a latch.

As a result, there is exhibited an effect that a change in input signal occurring on an input side does not have any effect on an output side.

According to a fourth aspect of the present invention, there is provided a method of reading out data from a synchronous storage device, the method comprising the steps of:

comparing a potential of a reference-voltage line, to which a potential for activating any one of the pairs of bit lines is applied, with a potential of the pair of bit lines which was discharged to a zero in advance; and forcibly changing the clock signal supplied to a precharge circuit from "H" level to "L" level when the potential of the pair of bit lines becomes equal to the potential of the reference-voltage line.

As a result, there is exhibited an effect that the length of a precharge period can be reduced to a required minimum, allowing a read cycle time to be shortened as well.

According to a fifth aspect of the present invention, there is provided a synchronous storage device wherein:

a comparator is used for comparing a potential of one of bit lines pertaining to any one of the pairs of bit lines with a potential of the other bit line of the pair and for outputting a match signal when the potentials become equal to each other; and an AND circuit is used for generating an internal clock signal representing a computed logical product of the inverted signal of the match signal output by the comparator and the clock signal supplied by the external source and for outputting the internal clock signal to a precharge circuit.

As a result, there is exhibited an effect that the read cycle time can be shortened without substantially changing the configuration of the synchronous RAM.

BRIEF DESCRIPTION OF THE DRAWINGS

Preferred embodiments of the present invention are described with reference to the following drawings wherein.

DESCRIPTION OF THE PREFERRED EMBODIMENTS

The present invention will become more apparent from a careful study of the following detailed description of some preferred embodiments with reference to accompanying diagrams.

Embodiment 1

Figure 1:
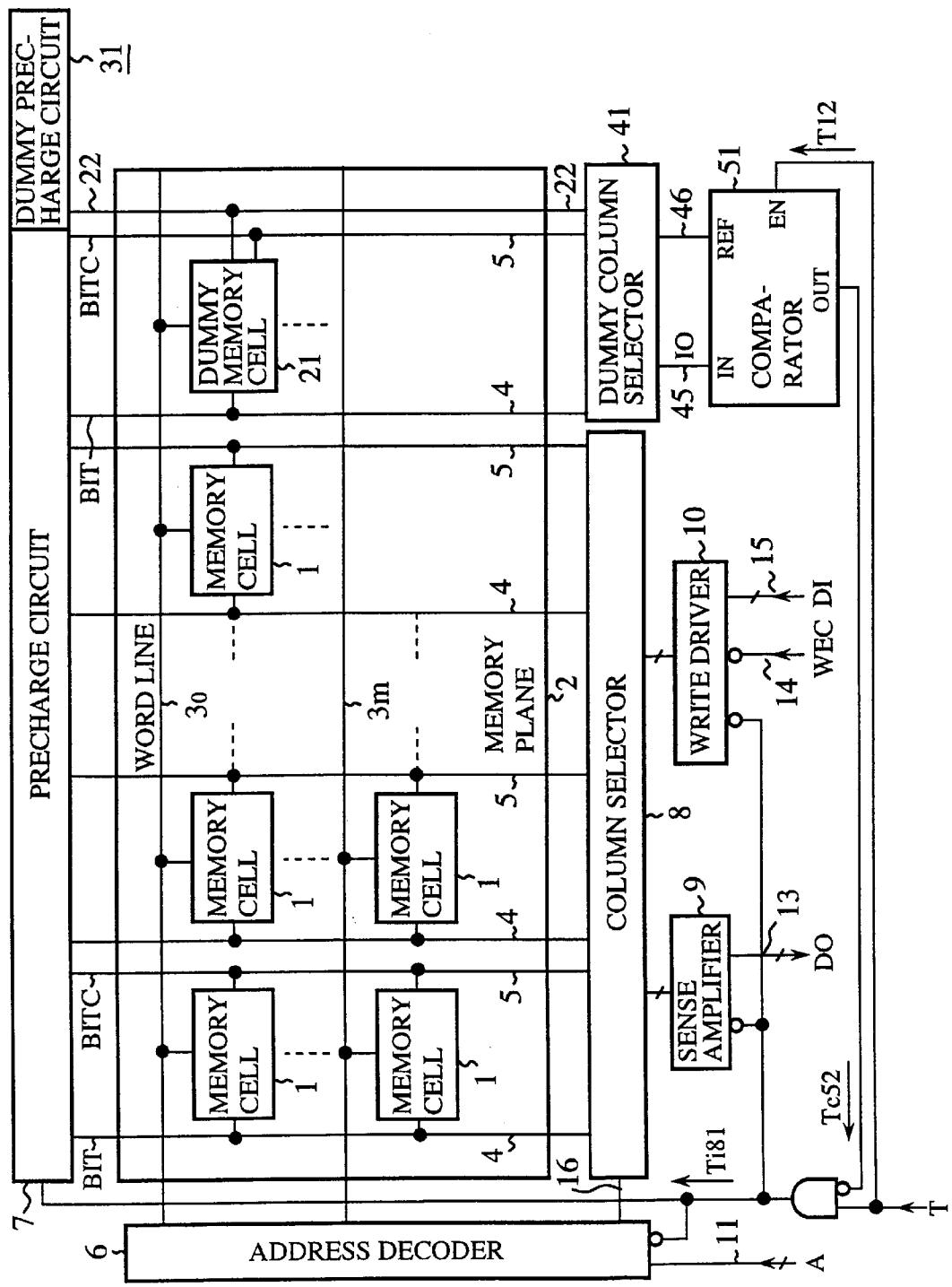
FIG. 1 is a schematic diagram showing a synchronous storage device as implemented by a first embodiment of the present invention.
Figure 2:
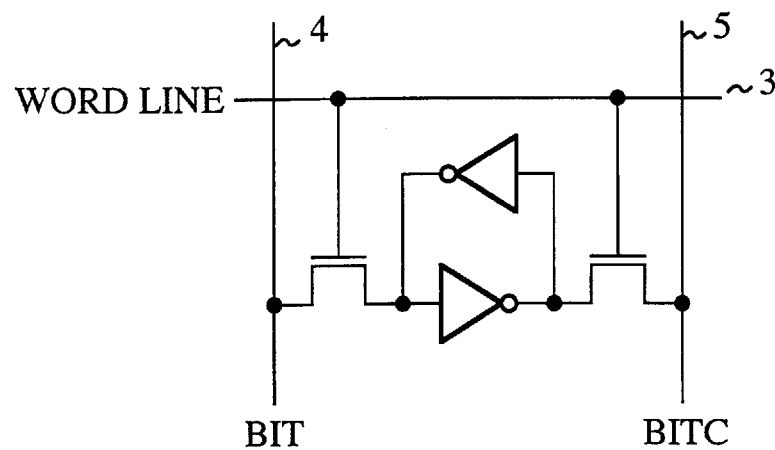
FIG. 2 is a circuit diagram showing a memory cell of the synchronous storage device implemented by the first embodiment of the present invention.
Figure 3:
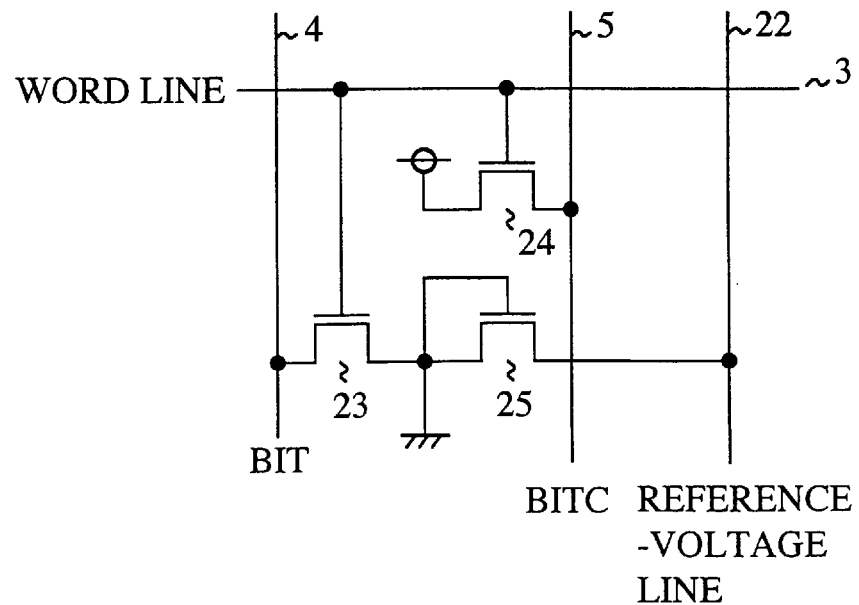
FIG. 3 is a circuit diagram showing a dummy memory cell of the synchronous storage device implemented by the first embodiment of the present invention.
Figure 4:
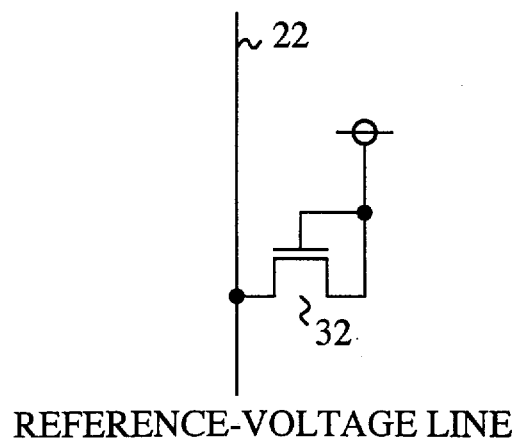
FIG. 4 is a diagram showing a dummy precharge circuit of the synchronous storage device implemented by the first embodiment of the present invention.
Figure 5:
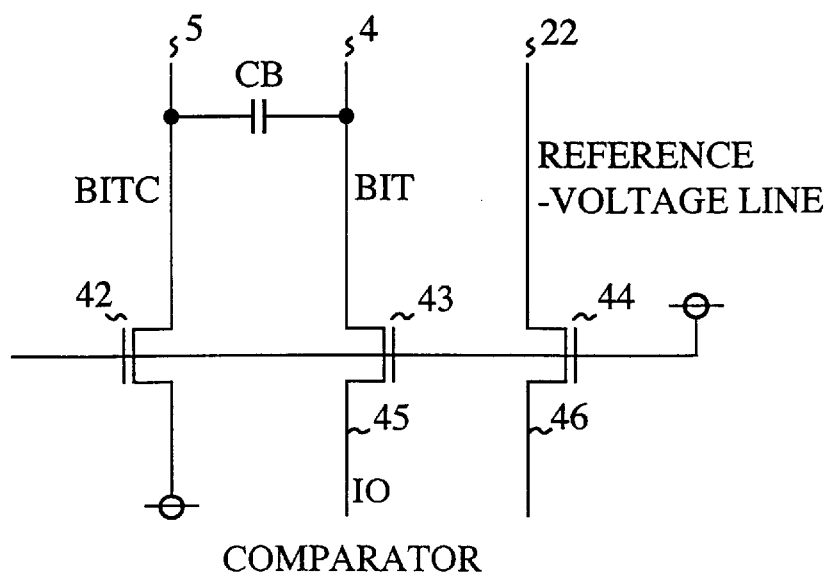
FIG. 5 is a circuit diagram showing a dummy column selector of the synchronous storage device implemented by the first embodiment of the present invention.
Figure 6:
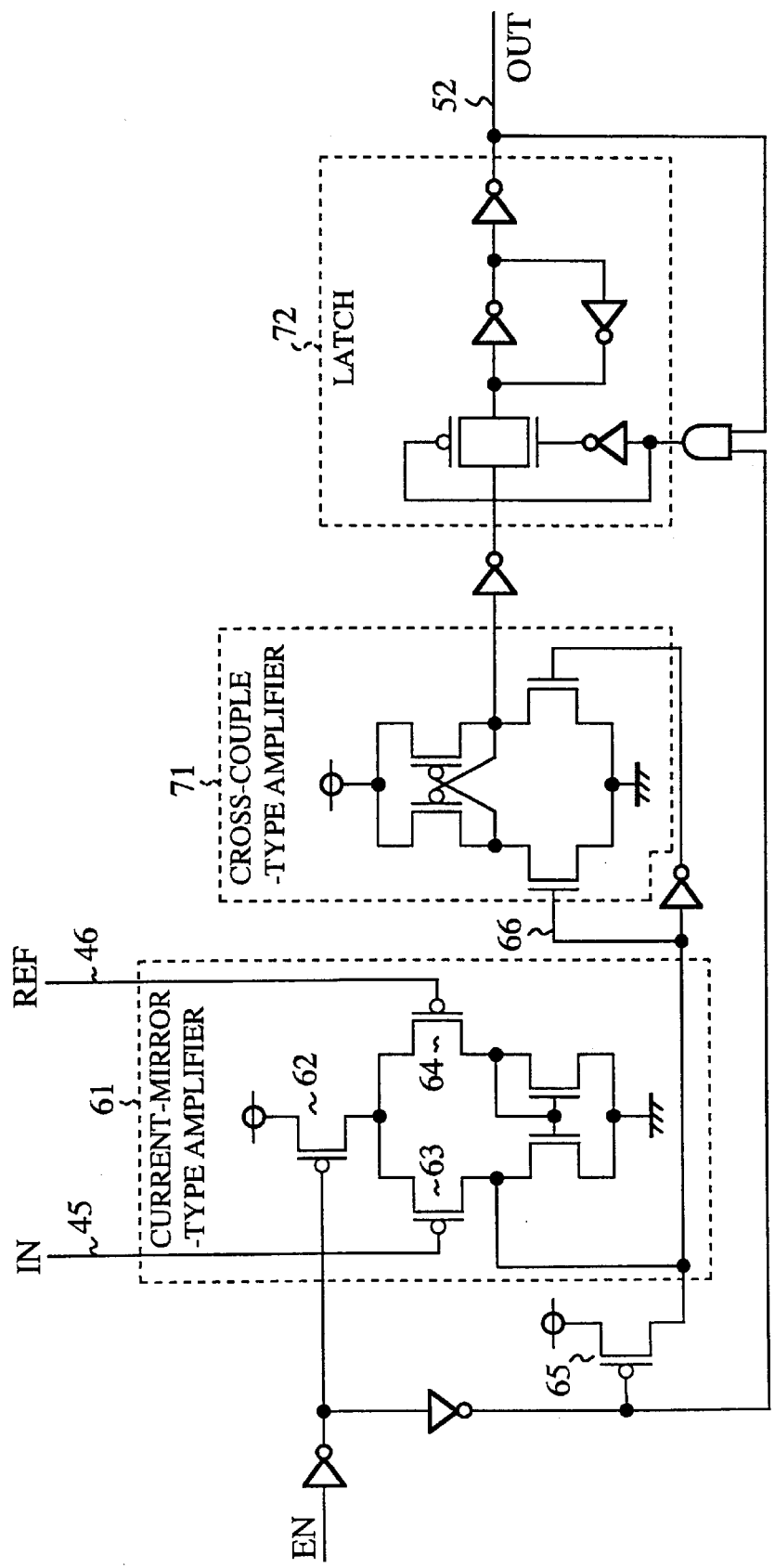
FIG. 6 is a diagram showing a comparator circuit of the synchronous storage device implemented by the first embodiment of the present invention.

FIG. 1 is a schematic diagram showing a synchronous storage device as implemented by a first embodiment of the present invention. FIG. 2 is a circuit diagram showing a memory cell of the synchronous storage device implemented by the first embodiment of the present invention. FIG. 3 is a circuit diagram showing a dummy memory cell of the synchronous storage device implemented by the first embodiment of the present invention. FIG. 4 is a diagram showing a dummy precharge circuit of the synchronous storage device implemented by the first embodiment of the present invention. FIG. 5 is a circuit diagram showing a dummy column selector of the synchronous storage device implemented by the first embodiment of the present invention. FIG. 6 is a diagram showing a comparator circuit of the synchronous storage device implemented by the first embodiment of the present invention.

In the drawing, reference numerals 1 denotes a memory cell for storing one-bit data; as shown in FIG. 2, the memory cell comprises two pass transistors connected to bit lines 4 and 5 and to a word line 3, and inverters connected between the two pass transistors. Reference numeral 2 is a memory plane 2 on which a plurality of memory cells 1 are laid out to form a matrix comprising rows and columns. Reference numerals $3_0$ to $3_m$ are each a word line connected to the pass transistors of the memory cells 1 on a row; the pass transistors are used for selecting the respective memory cell 1. Reference numerals 4 and 5 each denote a bit line connected to the memory cells 1 on a column.; forming a pair of bit lines, the bit lines 4 and 5 are used for transferring data to and from the memory cells 1. Reference numeral 6 is an address decoder for decoding an address signal A. A result of the address decoding carried out by the address decoder 6 selects one of the word lines $3_0$ to $3_m$. Reference numeral 7 is a precharge circuit for electrically precharging the bit lines 4 and 5. Reference numeral 8 denotes a column selector for selecting a column of memory cells 1 laid out on the memory plane 2 as a column on which a read or write operation is to be carried out.

Reference numeral 9 is a sense amplifier for reading out data from one of the memory cells 1 selected by the address decoder 6 and the column selector 8. On the other hand, reference numeral 10 denotes a write driver for writing data into one of the memory cells 1 selected by the address decoder 6 and the column selector 8. Reference numeral 11 is an address bus for propagating the address signal A to the address decoder 6. Reference numeral 12 denotes a clock signal T supplied by an external source. Reference numeral 13 is a data bus for outputting data DO generated by the sense amplifier 9. Reference numeral 14 denotes a signal line for propagating a write enable signal WEC and reference numeral 15 is a data bus for propagating data DI to be written into one of the memory cells 1 by the write driver 10.

Reference numeral 21 is a dummy memory cell (a precharge-time-width reducing means): when a word line $3_n$ is activated (where n is a number in the range 0 to m), the dummy memory cell 21 makes the electric charges of the other inactivated word lines 3 equal to each other by resetting the bit line 4 connected to the dummy memory cells 21 at "L" level and setting the bit line 5 connected to the dummy memory cells 21 at "H" level. As shown in FIG. 3, a detailed circuit diagram of the dummy memory cell 21, the dummy memory cell 21 is connected to one of the word lines $3_0$ to $3_m$, one of the pairs of bit lines 4 and 5 and a reference-voltage line 22. A transistor 25 of the dummy memory cell 21 connected to the reference-voltage line 22 is an off transistor for making the capacity of the reference-voltage line 22 equal to that of the bit line 5.

Reference numeral 31 shown in FIG. 1 is a dummy precharge circuit (the precharge-time-width reducing means) for holding the reference-voltage line 22 at "H" level; as shown in FIG. 4, this dummy precharge circuit 31, connected to the reference-voltage line 22, electrically precharges this line 22 through a transistor 32. In this case, the capacity of the reference-voltage line 22 is made equal to that of the bit line 5 as described above and that the potential of the reference-voltage line 22 is equal to the "H" level of the bit line 5.

Reference numeral 41 shown in FIG. 1 is a dummy column selector (the precharge-time-width reducing means) for adding electric charges of equal capacity to the bit lines 4 and 5. A capacity equal to that of an ordinary memory cell 1 is added to the output side of the bit line 4 and to a signal appearing on the reference-voltage line 22. As shown in FIG. 5, a circuit diagram showing details of the dummy column selector 41, one of the pairs of bit lines 4 and 5, one of the word lines $3_0$ to $3_m$ and the reference-voltage line 22 are connected to the input side of the dummy column selector 41, whereas an IO signal 45 through a transistor 43 and a signal 46 appearing on the reference-voltage line 22 through a transistor 44 are connected to the output side thereof. Here with the word line $3_n$ activated, where n is a number in the range 0 to m, the bit line 4 is reset at "L" level during an "L" period of the clock signal T12. As the clock signal T12 is set at "H" level, however, the precharge transistor is put in an ON state, setting the bit line 4 to "H" state as well.

A transistor 42 as well as the transistors 43 and 44 are each an ON transistor for adding an electric charge to each node. The bit line 5 is a node which is set at "H" level all the time. The node is provided to give an interline capacitance CB between the bit lines 4 and 5.

Reference numeral 51 shown in FIG. 1 is a comparator (the precharge-time-width reducing means) which is used for comparing the potential of the IO signal 45 on the bit line 4 output by the dummy selector 41 with that of the signal 46 on the reference-voltage line 22 also output by the dummy selector 41, and setting a signal 52 at the OUT terminal thereof at "H" level if the former is found equal to the latter. When the clock signal T12 supplied to an EN terminal thereof is set at "H" level, a P-type transistor 62 of a current-mirror-type amplifier 61 employed in the comparator 51 as shown in FIG. 6, a detailed circuit diagram showing the comparator 51, is put in an ON state, enabling the comparator 51. When the clock signal T12 supplied to the EN terminal thereof is reset at "L" level, on the other hand, a P-type transistor 65 employed in the current-mirror-type amplifier 61 is put in an ON state, setting a node 66 at "H" level. As a result, the signal 52 appearing at the OUT terminal is reset at "L" level. The signal 46 appearing on the reference-voltage line 22 is set at "H" level all the time. When the clock signal T12 changes from "L" level to "H" level, the IO signal 45 is electrically charged up from "L" level to "H" level gradually. As the potential of the IO signal 45 becomes equal to that of the signal 46 appearing on the reference-voltage line 22, a signal output by a cross-couple-type amplifier 71 employed in the comparator 51 is reset at "L" level, setting the signal 52 appearing at the OUT terminal at "H" level. With the potential of the IO signal 45 becoming equal to that of the signal 46 appearing on the reference-voltage line 22, a latch 72 employed in the comparator 51 holds the signal TC52 appearing at the OUT terminal at "H" level as long as the clock signal T12 is kept at "H" level. Therefore, a change in relation between the potential of the IO signal 45 and the potential of the signal 46 appearing on the reference-voltage line 22 that may occur thereafter will not affect the signal TC52 appearing at the OUT terminal.

Reference numeral 81 shown in FIG. 1 is an internal clock signal Ti which is obtained as a logical product of the clock signal T12 supplied by a source external to the storage device and the inverted signal of the signal Tc, denoted by reference numeral 52, appearing at the OUT terminal of the comparator 51. The internal clock signal Ti is supplied to the precharge circuit 7, the sense amplifier 9 and the write driver 10.

The operation of the synchronous storage device implemented by the first embodiment of the present invention as shown in FIG. 1 is explained as follows.

Figure 7:
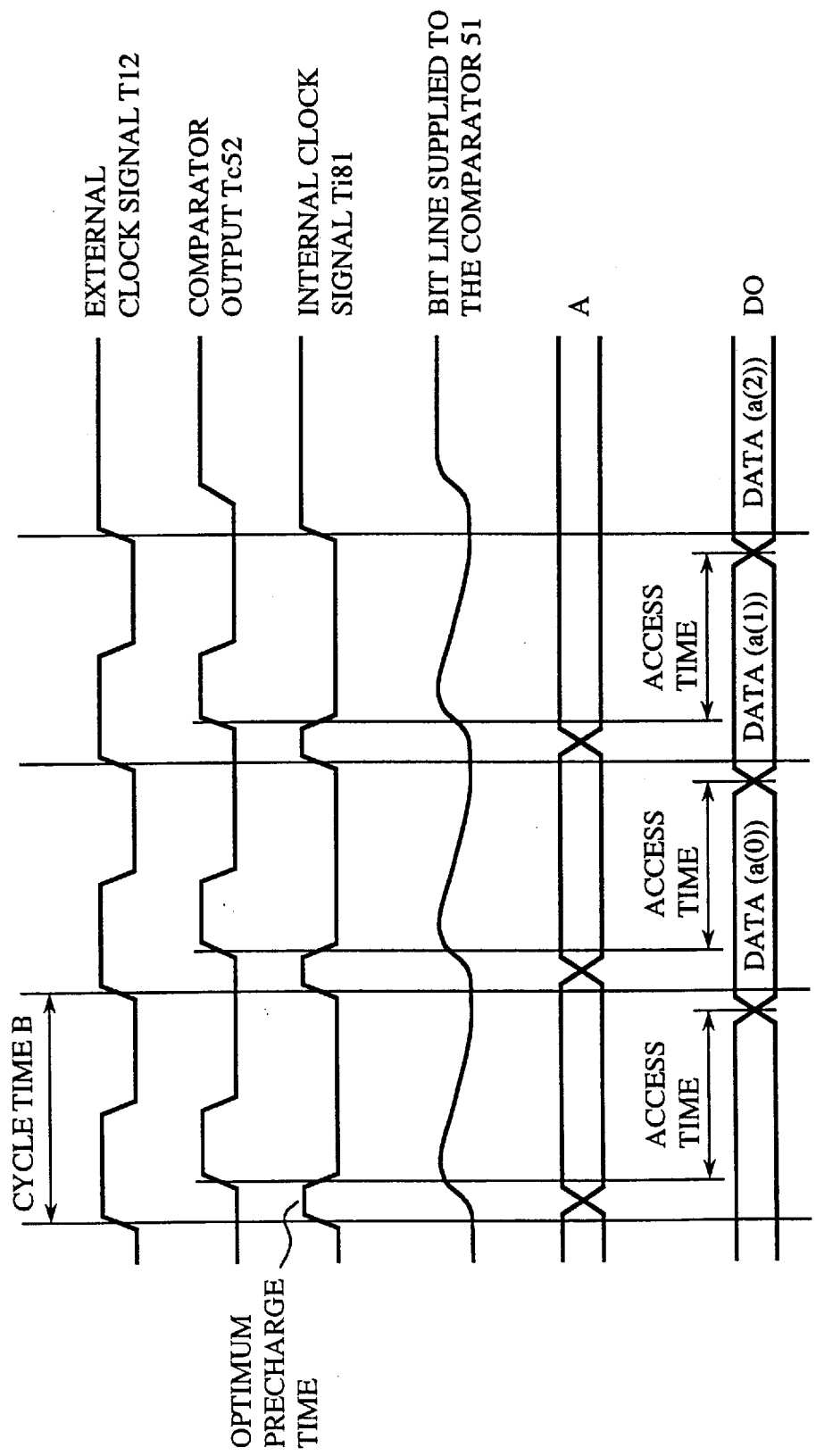
FIG. 7 is timing charts showing a method of reading out data from the synchronous storage device implemented by the first embodiment of the present invention.

FIG. 7 is timing charts showing a method of reading out data from the synchronous storage device implemented by the first embodiment of the present invention. First of all, during the "L" period of the clock signal T12, the signal TC52 output by the comparator 51 is also reset at "L" level. Even if the clock signal T12 changes to "H" level, the signal TC52 output by the comparator 51 will remain at "L" level as long as the potential of the IO signal 45 is not equal to that of the signal 46 appearing on the reference-voltage line 22. With the clock signal T12 set to "H" level and the signal TC52 output by the comparator 51 remaining at the "L", on the other hand, the internal clock signal Ti81 is set at "H" level, causing the bit lines 4 and 5 to be electrically charged up. As the potential of the IO signal 45 becomes equal to that of the signal 46 appearing on the reference-voltage line 22, the signal TC52 output by the comparator 51 turns to "H" level, causing the internal clock signal Ti81 to be reset to "L" level compulsively even if the clock signal T12 is set at "H" level. With the internal clock signal Ti81 reset at "L" level, the synchronous storage device (RAM) starts a read operation.

With the internal clock signal Ti81 being reset at "L" level, a word line $3_n$ where n is a number in the range 0 to m, one of the word lines $3_0$ to $3_m$ selected by the address decoder 6, is set to "H" level. At that time, data DO is read out from the memory cells 1 connected to the selected word line $3_n$ and output by way of the pairs of bit lines 4 and 5, the column selector 8 and the sense amplifiers 9.

As described above, according to the first embodiment, the "H" period of the clock signal supplied to the precharge circuit 7 is controlled in the synchronous RAM and reduced to a required minimum, allowing the precharge time to be shortened to a required minimum as well. As a result, there is exhibited an effect of shortening the read cycle time.

Embodiment 2

Figure 8:
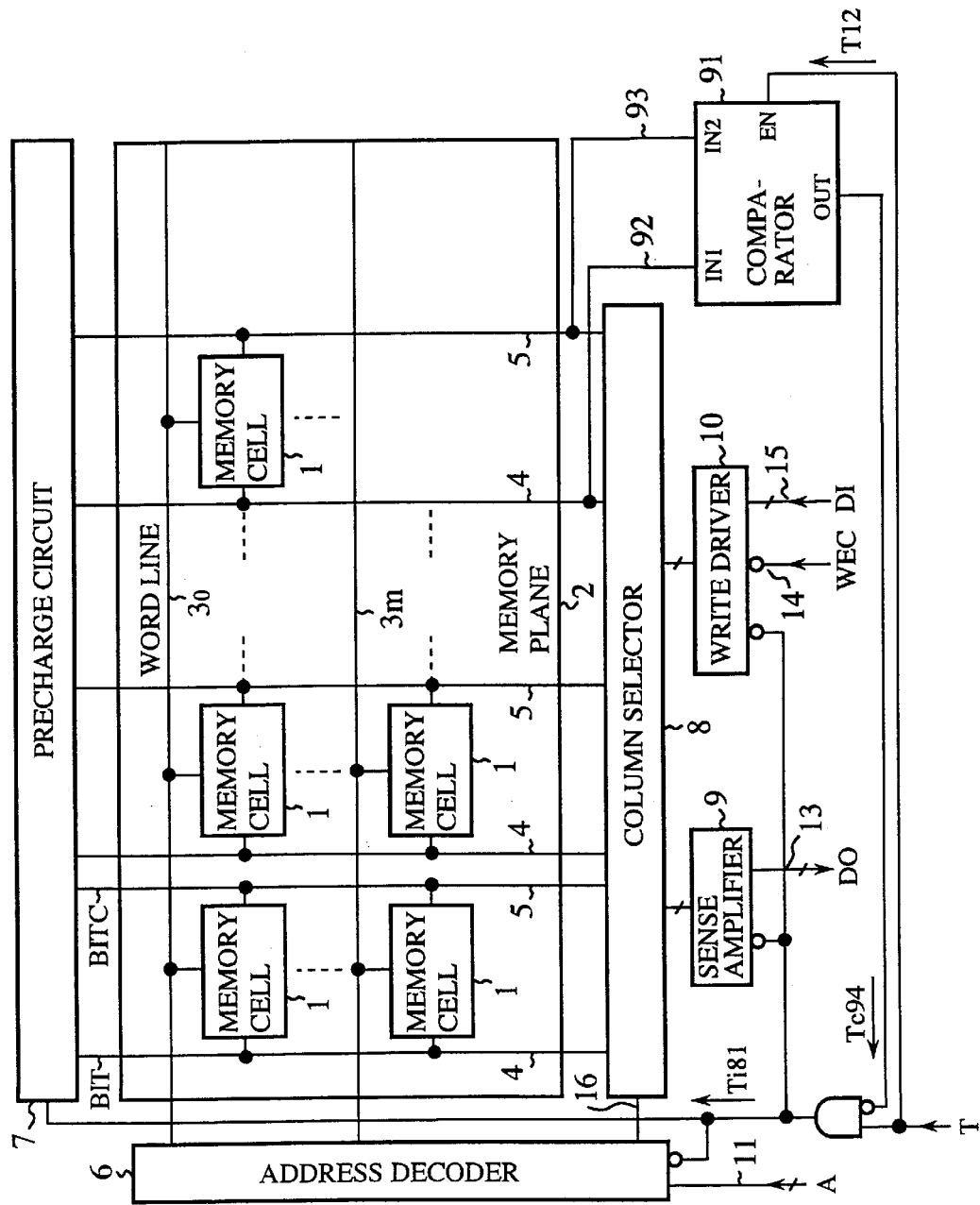
FIG. 8 is a schematic diagram showing a synchronous storage device as implemented by a second embodiment of the present invention.
Figure 9:
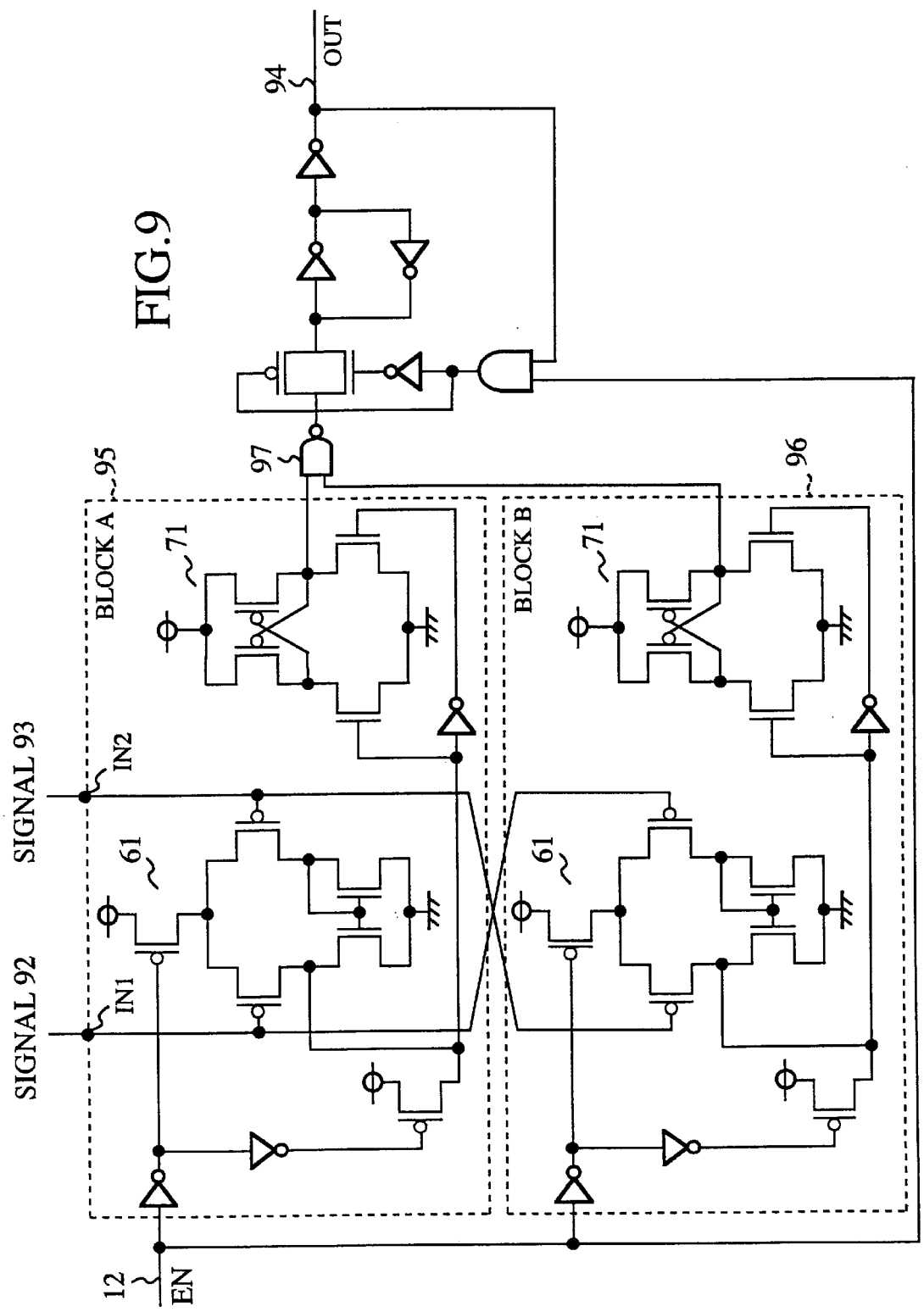
FIG. 9 is a diagram showing a comparator circuit of the synchronous storage device implemented by the second embodiment of the present invention.
Figure 10:
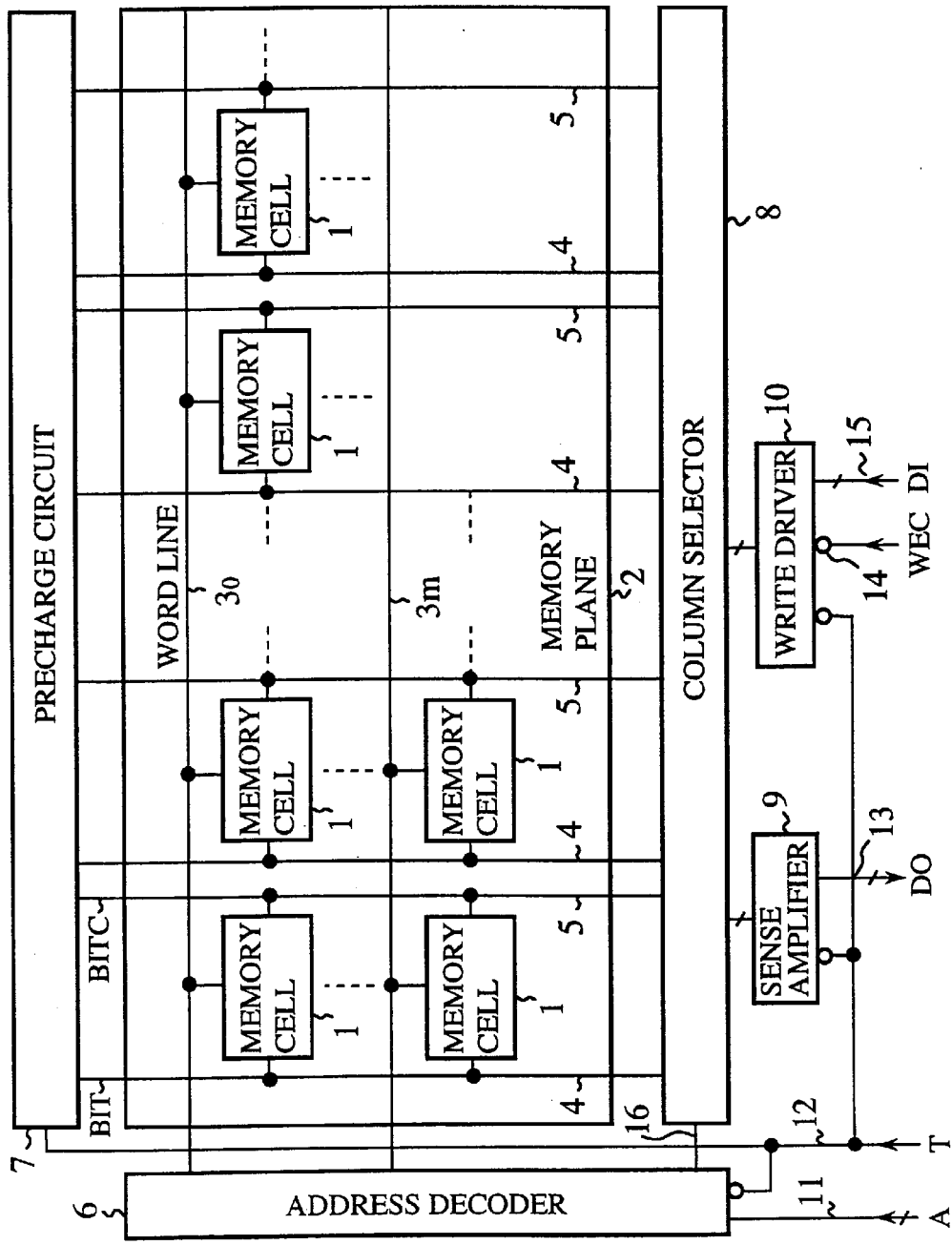
FIG. 10 is a diagram showing a configuration of main components composing the conventional synchronous RAM.
Figure 11:
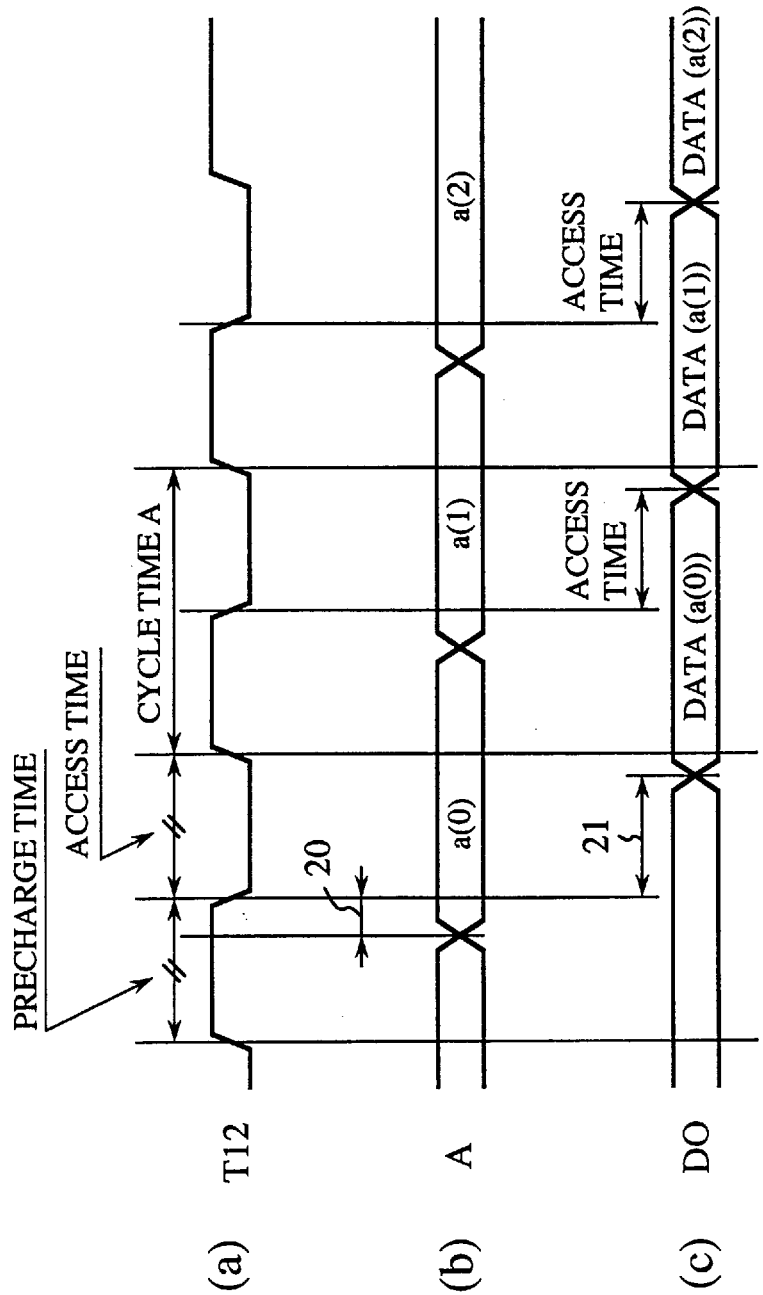
FIG. 11 show timing charts of an operation to read out data from the conventional synchronous RAM.

FIG. 8 is a schematic diagram showing a synchronous storage device as implemented by a second embodiment of the present invention. FIG. 9 is a diagram showing a comparator circuit of the synchronous storage device as implemented by the second embodiment of the present invention. Components of the second embodiment identical with or equivalent to those of the first embodiment are denoted by the same reference numerals and their description is omitted. In the case of the first embodiment described above, the internal clock signal Ti is generated by using a dummy column selector in order to shorten the width of the precharge period to a required minimum. In the case of the second embodiment, on the other hand, the internal clock signal Ti is generated without using a dummy column selector in order to shorten the width of the precharge period to a required minimum.

Reference numeral 91 is a comparator (a precharge-time-width reducing means) which is used for comparing the potential of a signal 92 appearing on the bit line 4 with the potential of a signal 93 appearing on the bit line 5 and setting an output signal Tc94 at the OUT terminal thereof at "H" level when the former is equal to the latter. As shown in FIG. 9, a circuit diagram showing details of the comparator 91, the comparator 91 comprises blocks A and B denoted by reference numerals 95 and 96 respectively. Each of the A and B blocks 95 and 96 comprises a current-mirror-type amplifier 61 and a cross-couple-type amplifier 71 which are connected to each other in parallel, inverting the input. The comparator 95 of the block A compares the potential of the signal 92 appearing on the bit line 4 with the potential of a signal 93 appearing on the bit line 5. With the signal 93 on the bit line 5 set at "H" level and the signal 92 on the bit line 4 changing from "L" level to "H" level, becoming the same as the level of the signal 93, the comparator 95 resets one of the two signals input to a NAND gate 97 to "L" level. By the same token, the comparator 96 of the block A compares the potential of the signal 92 appearing on the bit line 4 with the potential of a signal 93 appearing on the bit line 5. With the signal 92 on the bit line 4 set at "H" level and the signal 93 on the bit line 5 changing from "L" level to "H" level, becoming the same as the level of the signal 92, the comparator 96 resets the other signal input to the NAND gate 97 to "L" level. In either case, a signal Tc94 appearing at the OUT terminal of the comparator 91 is set to "H" level.

The operation of the synchronous storage device implemented by the second embodiment as shown in FIG. 8 is explained as follows.

First of all, during the "L" period of the clock signal T12, the signal Tc94 output by the comparator 91 is also reset at "L" level. During the "H" level of the clock signal T12, however, the signal Tc94 output by the comparator 91 is set to an "H" level as soon as the potential of the signal 92 appearing on the bit line 4 becomes equal to that of a signal 93 appearing on the bit line 5. Thus, no equalizing operation is carried out on the bit lines 4 and 5. In addition, in this case, the comparator 91 sets each of the potentials of the bit lines 4 and 5 at a reference voltage. For this reason, the internal clock signal Ti81 is set at "H" level, electrically charging up the bit lines 4 and 5 till the precharge operation of the bit lines 4 and 5 is completed.

Thus, even if the clock signal T12 is set at "H" level, the internal clock signal Ti81 is forcibly reset to "L" level, resulting in a transition to a read operation. With the internal clock signal Ti81 reset at "L" level, the word line $3_n$ where n is a number in the range 0 to m, one of the word lines $3_0$ to $3_m$ selected by the address decoder 6, is set to "H" level. At that time, data DO is read out from the memory cells 1 connected to the selected word line $3_n$ and output by way of the pairs of bit lines 4 and 5, the column selector 8 and the sense amplifier 9.

As described above, according to the second embodiment, the internal clock signal Ti is generated, allowing the precharge time width to be shortened to a required minimum without providing a dummy column selector.

As a result, there is exhibited an effect that the read cycle time can be shortened without considerably modifying the configuration of the synchronous RAM.

What is claimed is:

1. A synchronous storage device comprising:

a plurality of memory cells each for storing one-bit data;

word lines connected to a pass transistor for selecting these memory cells;

a bit line pair, connected to said memory cell, used for transferring data;

an address decoder for decoding an address signal and selecting said word lines;

a precharge circuit for precharging said bit line pair in synchronization with a clock signal supplied thereto from an external source;

a column selector for selecting a column line to conduct a read or write operation out of column lines of said memory cell;

a sense amplifier for amplifying a potential of the bit line pair; and a write driver for driving the bit line pair to write the data in the memory cells, said synchronous storage device further comprising:

a reference-voltage line applied with a potential where said bit line pair is activated; and a precharge-time-width reducing means for compulsively changing the clock signal input to said precharge circuit from "H" level to "L" level when a potential of said reference-voltage line becomes equal to that of said bit line pair which is preliminarily discharged to zero while these potentials comparing with each other.

2. A synchronous storage device according to claim 1 wherein said precharge-time-width reducing means comprises:

a dummy precharge circuit for holding said reference-voltage line at "H" level;

a plurality of dummy memory cells for, when the word line is activated, resetting one bit line to "L" level and setting the other bit line to "H" level of said bit line pair, and making the word lines inactivated with a same capacity;

a dummy column selector for adding a same capacity to said bit line pair, and adding a same capacity as that of a normal memory cell at the output of one bit line and also adding the same capacity to a signal of said reference-voltage line;

a comparator for comparing a potential of a signal of said bit line pair having the same capacity through said dummy column selector with that of the signal of said reference-voltage line, and outputting a match signal when these potentials are equal to each other;

an AND circuit for generating an internal clock signal by calculating a logical product of an inverted signal of the match signal supplied from said comparator and the clock signal supplied from the external source, and outputting the internal clock signal to said precharge circuit.

3. A synchronous storage device according to claim 2 wherein said comparator comprises a current-mirror-type amplifier, a cross-couple-type amplifier and a latch.

4. A method of reading out data in a synchronous storage device which reads out data in synchronization with a clock signal to be input to a precharge circuit with respect to a word line selected by an address decoder and a memory cell connected to a bit line pair precharged by a precharge circuit, said method comprising the steps:

comparing a potential where said bit line pair is activated with that of a reference-voltage line to be applied and said bit line pair preliminarily discharged to zero; and changing forcibly the clock signal input to said precharge circuit from "H" level to "L" level when said potentials are equal to each other.

5. A synchronous storage device comprising:

a plurality of memory cells each for storing one-bit data;

word lines connected to a pass transistor for selecting these memory cells;

a bit line pair, connected to said memory cell, used for transferring data;

an address decoder for decoding an address signal and selecting said word lines;

a precharge circuit for precharging said bit line pair in synchronization with a clock signal supplied thereto from an external source;

a column selector for selecting a column line to conduct a read or write operation out of column lines of said memory cell;

a sense amplifier for amplifying a potential of the bit line pair; and a write driver for driving the bit line pair to write the data in the memory cells, said synchronous storage device further comprising:

a comparator for comparing a potential of a signal of one bit line with that of the other bit line, and outputting a match signal when these potentials are equal to each other; and an AND circuit for generating an internal clock signal by calculating a logical product of an inverted signal of the match signal supplied from said comparator and the clock signal supplied from the external source, and outputting the internal clock signal to said precharge circuit.

* * * * *